(12) United States Patent
Rolli et al.

(10) Patent No.: US 9,234,926 B2
(45) Date of Patent: *Jan. 12, 2016

(54) APPARATUS AND METHOD FOR MEASURING THE DISSIPATION FACTOR OF AN INSULATOR

(75) Inventors: Stefano Rolli, Bologna (IT); Gianpaolo De Robertis, San Clemente (IT); Stefano Serra, San Vittore Olona (IT); Gian Carlo Montanari, Casalecchio Di Reno (IT)

(73) Assignee: TECHIMP HQ S.R.L., Zola Predosa (IT)

( * ) Notice: Subject to any disclaimer, the term of this patent is extended or adjusted under 35 U.S.C. 154(b) by 45 days.

This patent is subject to a terminal disclaimer.

(21) Appl. No.: 13/806,763

(22) PCT Filed: Jun. 22, 2011

(86) PCT No.: PCT/IB2011/052728
§ 371 (c)(1),
(2), (4) Date: Dec. 22, 2012

(87) PCT Pub. No.: WO2012/001585
PCT Pub. Date: Jan. 5, 2012

(65) Prior Publication Data
US 2013/0107410 A1    May 2, 2013

(30) Foreign Application Priority Data
Jun. 29, 2010    (IT) .............................. BO2010A0413

(51) Int. Cl.
G01R 27/26 (2006.01)
H02H 1/00 (2006.01)
H02H 3/20 (2006.01)

(52) U.S. Cl.
CPC ............. *G01R 27/2694* (2013.01); *H02H 1/00* (2013.01); *H02H 3/20* (2013.01)

(58) Field of Classification Search
USPC ................. 324/713, 522, 691, 609, 551–554, 324/658–690, 220, 303, 679.01, 86, 705, 324/519, 72.5; 702/64; 327/52, 67, 359; 29/601, 825, 887
See application file for complete search history.

(56) References Cited

U.S. PATENT DOCUMENTS

| 4,757,263 A | 7/1988 | Cummings, III et al. |
| 4,914,382 A | 4/1990 | Douville et al. |

(Continued)

FOREIGN PATENT DOCUMENTS

| CN | 1748149 A | 3/2006 |
| CN | 101365955 A | 2/2009 |

(Continued)

OTHER PUBLICATIONS

Stirl T. et al.: "On-line Condition Monitoring and Diagnosis for Power Transformers their Bushings, Tap Changer and Insulation System", CMD, 2006, pp. 1-6, XP002631687, Changwong, Korea, Retrieved from the Internet: URL: http://www.uni-stuttgart.de/ieh/forschung/veroeffentlichungen/CMD2006-Tobias.pdf [retrieved on Mar. 30, 2011].

(Continued)

*Primary Examiner* — Melissa Koval
*Assistant Examiner* — Nasima Monsur
(74) *Attorney, Agent, or Firm* — Pearne & Gordon LLP

(57) ABSTRACT

An apparatus for measuring the loss factor of an insulator for medium or high voltages is equipped with a tap adapter forming a point for picking up an electrical signal, and comprises a reference capacitor having a first electrode connected to the tap adapter and a second electrode; a first voltage detection module is connected to the first electrode of the reference capacitor for detecting a signal representative of the voltage applied to the reference capacitor; an active electronic device is connected to earth and to the second electrode of the reference capacitor for keeping the potential of the second electrode at a predetermined reference value; a second voltage detection module is connected to an output of the active electronic device in order to detect a signal representative of the electric current that flows through the reference capacitor.

18 Claims, 3 Drawing Sheets

(56) References Cited

U.S. PATENT DOCUMENTS

| | | | |
|---|---|---|---|
| 5,561,239 A * | 10/1996 | Yasuda | 73/35.08 |
| 5,652,521 A * | 7/1997 | Meyer | 324/551 |
| 5,933,310 A * | 8/1999 | Eggendorfer | 361/104 |
| 6,340,891 B1 * | 1/2002 | Yagi et al. | 324/551 |
| 6,433,557 B1 | 8/2002 | Rashkes et al. | |
| 6,446,027 B1 * | 9/2002 | O'Keeffe et al. | 702/183 |
| 6,927,562 B2 | 8/2005 | Anand et al. | |
| 7,292,048 B2 * | 11/2007 | Borsi et al. | 324/632 |
| 2002/0079906 A1 | 6/2002 | Rashkes et al. | |
| 2003/0160602 A1 | 8/2003 | Anand et al. | |
| 2004/0119455 A1 * | 6/2004 | Sunter | 324/76.77 |
| 2005/0075076 A1 * | 4/2005 | Grun | 455/67.11 |
| 2005/0218906 A1 * | 10/2005 | Younsi et al. | 324/551 |
| 2011/0031980 A1 * | 2/2011 | Kruger et al. | 324/547 |

FOREIGN PATENT DOCUMENTS

| | | |
|---|---|---|
| JP | 56 0112662 A | 9/1981 |
| JP | 2006 0170666 A | 6/2006 |
| WO | 2004/057346 A1 | 7/2004 |

OTHER PUBLICATIONS

Zhang S.: "Analysis of Some Measurement Issues in Bushing Power Factor Tests in the Field", IEEE Transactions on Power Delivery, IEEE Service Center, New York, NY, US, vol. 21, No. 3, Jul. 1, 2006, pp. 1350-1356, XP011148987, ISSN: 0885-8977, D01: D01:10. 1109/TPWRD.2006.874616.

Pei Wang et al.: "A Digital Technique for the On-line Measurement of Dissipation Factor and Capacitance", IEEE Transactions on Dielectrics and Electrical Insulation IEEE USA, vol. 8, No. 2, Apr. 2001, pp. 228-232, XP002633951, ISSN: 1070-9878.

* cited by examiner

APPARATUS AND METHOD FOR MEASURING THE DISSIPATION FACTOR OF AN INSULATOR

TECHNICAL FIELD

This invention relates to an instrument and a method for measuring the loss factor of an insulator.

More specifically, this invention relates to an instrument and a method for measuring the loss factor of an insulator (also called bushing) for medium or high voltages, equipped with a tap adapter forming a point for picking up an electrical signal.

More in detail, the invention regards an instrument and a method for measuring the loss factor of an insulator of a medium- or high-voltage transformer, that is to say, an insulator designed to insulate the conductors leading out of the transformer relative to the casing of the transformer itself (or relative to the other conductors in the case of three-phase equipment).

The loss factor—also known as loss angle or tan delta—is a measure of the deviation of the electric behaviour of a real capacitor (or real insulating system) with respect to that of a perfect system.

In effect, the current flowing through a perfect capacitor with an alternating voltage applied to it (which can be represented in a plane by a vector) is in quadrature relative to the voltage, that is to say, it corresponds to a vector displaced at 90 degrees from the voltage vector.

In a real capacitor, on the other hand, comprising a dielectric material which is not perfect (and whose conductance is therefore not zero), the voltage and current are displaced at an angle of less than 90 degree, and the difference between 90 degrees and the real displacement angle is an angle denoted delta.

The loss factor (or tan delta, or power factor, or loss angle) is the tangent of the angle delta.

Generally speaking, the tap adapter comprises a terminal located in the insulator to provide a signal indicating an eddy (or leakage or loss) current which flows through the insulator; normally, the tap adapter (also known as capacitive tap) has a shielded output as, for example, in a coaxial cable.

BACKGROUND ART

For monitoring a three-phase high-voltage transformer by measuring quantities correlated with the loss factor, several solutions are known in the prior art, described briefly below.

U.S. Pat. No. 4,914,382 describes a sensor having a resistor between a tap adapter and earth (coupled to a capture instrument by a measuring transformer).

This solution allows measurement only of a signal correlated with the current that flows through the insulation, whereas quantities indicating the voltage applied to the insulation cannot be measured.

Besides this limitation, this technical solution has some drawbacks linked to the presence of the inductive coupling (that is, the measuring transformer), including the risk of introducing unwanted displacements, thus reducing measuring precision because of the additional impedance devices used, and narrowing the sensor's detection bandwidth.

U.S. Pat. No. 6,927,562 describes a sensor comprising a reference capacitor connected across the tap adapter and earth. Thus, a measurement of the voltage is taken at the capacitor electrode connected to the tap adapter, for detecting a signal indicating the voltage applied to the reference capacitor.

This solution, too, however, is not free of drawbacks in that it allows measurement only of a signal correlated with the voltage along the insulation whereas it does not allow detection of any signal indicating the current travelling in the insulation.

U.S. Pat. No. 4,757,263 describes a sensor equipped with a capacitive divider for detecting a signal indicating the voltage applied to the reference capacitor. Further, the device of U.S. Pat. No. 4,757,263 is configured to make a comparison with a reference source.

The disadvantage of this device, however, is that does not allow detection of any signal indicating the current flowing through the insulation.

It should be noted that often, in the field of devices for detecting signals correlated with the tan delta in a medium- or high-voltage insulator, the need is also felt to maximize the passband so as to detect a signal useful both for estimating the tan delta (in that case it is necessary to detect components in low frequency) and for detecting current pulses correlated with partial discharges, if any, present in the insulation (in that case it is necessary to detect components in high frequency).

In effect, it is known that estimating the loss factor and analysing the partial discharges are two different and, in certain respects, complementary techniques of diagnosing an insulation system and in many cases it is desirable to use both techniques in combination.

In light of this, it should be noted that U.S. Pat. No. 6,433,557 describes a circuit for picking up the signal from the tap adapter and comprising a reference capacitor connected across the tap adapter and earth, and an inductive coupling (that is, a signal transformer) coupled to the circuit leg formed by the reference capacitor.

This system is designed to measure simultaneously a signal indicating a voltage applied to the insulator (having only low frequency components) and a signal indicating high-frequency current pulses).

This solution, however, has the disadvantage of not allowing detection of a signal indicating the current flowing in the insulation and having low-frequency components useful for the tan delta.

This circuit also has the disadvantage of requiring the presence of the signal transformer (that is, of an inductive coupling), leading to problems of displacement, use of additional impedance devices and bandwidth limitations (similarly to what is stated above in connection with U.S. Pat. No. 4,914,382.

More generally, it should be noted that the above mentioned devices have the following limitations.

With these devices it is not possible to directly detect a set of data sufficient to directly derive (that is, estimate by calculation) the tan delta. In effect, it should be noted that to perform a true volt-amp measurement, it would be necessary to measure the high voltage applied to the insulation, but such a measurement is not performed because of the excessive risks and drawbacks consequent upon the high level of the voltage. involved (so much so that the tap adapter is used).

In light of this, all the prior art systems are unable to provide significant data for estimating the tan delta based on values measured at a given point in time; thus, the data provided by the prior art devices mentioned above are used for relative processing, that is to say, for comparison with previously detected data (time-trend analysis) or for comparisons between the data measured in the different phases of a polyphase transformer.

From patent document JP56112662A it is known a measuring apparatus for measuring the loss factor of capacity element. In this apparatus a current/voltage converter is directly connected to the measured element (which, in turn, is connected to a voltage source); indeed, said apparatus does not comprise any reference capacitor.

Therefore, the apparatus of JP56112662A could not be used to measure the loss factor of a medium or high voltage capacitor, where the capacitor itself is accessible through a tap adapter and the voltage source is not accessible.

AIM OF THE INVENTION

This invention has for an aim to provide an apparatus and a method for measuring the loss factor of an insulator for medium or high voltages and which overcome the above mentioned disadvantages of the prior art.

In particular, the aim of this invention is to provide an apparatus and a method for measuring the loss factor of an insulator for medium or high voltages and which can detect complete and significant data sets for estimating the tan delta, even by performing measurements at a single instant and on a single phase of a poly-phase transformer.

Another aim of this invention is to provide an apparatus and a method for measuring the loss factor of an insulator for medium or high voltages and which makes it possible (using the same signals as those detected for measuring, or estimating the tan delta) to also detect significant data for detecting and analysing partial discharge signals.

A further aim of the invention is to allow a measurement (or an estimation) of the loss factor which is particularly robust and sensitive to possible variations in the reference capacitor.

These aims are fully achieved by the apparatus and method according to the invention as characterized in the appended claims.

More specifically, the apparatus according to the invention is an apparatus for measuring (that is, for detecting data for the purpose of estimating) the loss factor of an insulator for medium or high voltages, equipped with a tap adapter forming a point for picking up an electrical signal.

The apparatus comprises a reference capacitor having a first electrode, which can be connected to the tap adapter, a second electrode and a first voltage detection module operatively connected to the first electrode of the reference capacitor for detecting a signal representative of the voltage applied to the reference capacitor.

Typically, the reference capacitor is a capacitor having a loss factor particularly small; in particular, the reference capacitor is selected is such a way that the loss factor of the reference capacitor is lower than the minimum value of loss factor that has to be detected, according to the sensitivity desired for the instrument.

Ideally, the loss factor of the reference capacitor should be null; however, in practice, the reference capacitor has a non-null loss factor, which is correlated to the sensitivity of the apparatus, as explained above.

Preferably, the reference capacitor has a capacitance is in the range 100 nF-20 µF; the fact that the capacitance of the reference capacitor is typically (significantly) larger than the an eddy capacitor formed by the tap adapter secures that the current flowing in said eddy capacitor is negligible with respect to the current flowing in the reference capacitor (in other wards, the current flowing in the reference capacitor is the large majority of the current flowing in the capacitor of the insulator under test).

According to the invention, the apparatus comprises an active electronic device connected to earth and to the second electrode of the reference capacitor and configured to keep the potential of the second electrode at a predetermined reference value. The apparatus also comprises a second voltage detection module which is operatively connected to an output of the active electronic device in order to detect a signal representative of the electric current that flows through the reference capacitor.

Preferably, the first voltage detection module has an input impedance which is particularly large, in particular, significantly larger than the impedance of the device under test.

Preferably, the active electronic device is suitable for providing at output a current of at least 10 mA.

Similarly, the invention provides a method for measuring the loss factor of an insulator for medium or high voltages, equipped with a tap adapter forming a point for picking up an electrical signal.

According to the invention, the method comprises the following steps:
preparing a reference capacitor having a first electrode and a second electrode and connecting the first electrode to the tap adapter;
preparing an active electronic device connected to earth and to the second electrode of the reference capacitor and configured to keep the potential of the second electrode at a predetermined reference value;
detecting a signal representative of the voltage applied to the reference capacitor, using a first voltage detection module connected to the first electrode of the reference capacitor;
detecting a signal representative of the electric current that flows through the reference capacitor, using a second voltage detection module connected downstream of the active electronic device.

The loss factor can be calculated by dividing the detected voltage applied to the reference capacitor and the detected electric current that flows through the reference capacitor.

Preferably, the active electronic device is configured to keep the second electrode of the reference capacitor connected to virtual earth; that is to say, the reference value for the potential of the second electrode of the reference capacitor is the earth potential.

The fact of keeping the potential of the second electrode of the reference capacitor at a steady known value makes it possible to detect a quantity representative of the current which flows in the insulation, without corrupting the measurement, that is to say, without having to include resistors or inductive couplings in the reference capacitor leg of the circuit.

Hence, the invention allows the alternating current that flows in the insulation to be detected by simultaneously detecting a quantity correlated with the voltage applied to the insulation; in effect, the voltage across the terminals of the reference capacitor is measured without this measurement being corrupted or distorted by the corresponding measurement of the current (thanks to the presence of the active electronic device, which dynamically steadies the potential of the second electrode of the reference capacitor).

Therefore, based on the data which can be detected by the apparatus according to the invention, it is possible to make a good estimation of the loss factor as a function of the data detected in the same detection instant (without resorting to relative processing between insulators of the different phases of a single transformer or time-trend analysis of the quantities detected).

In effect, the apparatus and method according to the invention make it possible to perform a volt-amp measurement on the reference capacitor (using the tap adapter), which corresponds to a volt-amp measurement on the insulator being tested, subject to the non-ideal nature of the reference capacitor.

According to a further aspect of the invention, the apparatus comprises a generator module for injecting a direct electric current into the insulation (the module comprises, for example, a current generator or a voltage generator). More specifically, the module is configured to inject a predetermined electric current into a node defined by the first electrode of the reference capacitor.

Similarly, according to said further aspect of the invention, the method comprises a step of injecting a direct electric current into the first electrode of the reference capacitor in order to generate a dc voltage variation in the insulation.

That way, the step of detecting a signal representative of the voltage applied to the reference capacitor makes it possible to register the voltage variations in the insulation due to the direct current injected.

This detection provides precious information for estimating the loss factor of the insulation since the voltage variation is correlated with the non-ideal quality (and hence to the loss factor) of the insulation itself.

Preferably, connected to the first electrode of the reference capacitor, there is an electronic device designed to define a very high impedance (for example, an operational amplifier in buffer configuration, or other equivalent circuit solutions).

Advantageously, that provides a very high impedance (avoiding current absorption and allowing voltage to be measured correctly and accurately) and, at the same time, impedance adaption, with the possibility of driving an acquisition instrument connected downstream and having a 50 Ohm input stage.

According to a further aspect of the invention, the apparatus allows detection of signals having both low-frequency components (useful for estimating the loss factor) and high-frequency components (useful for detecting signals correlated with the partial discharges that occur in the insulator).

This is possible thanks to the fact that the active electronic device (and, if necessary, the operational amplifier in buffer configuration) form a particularly wide passband.

BRIEF DESCRIPTION OF THE DRAWINGS

These and other features of the invention will become more apparent from the following description of a preferred, non-limiting embodiment of it, with reference to the accompanying drawings, in which.

DETAILED DESCRIPTION OF THE PREFERRED EMBODIMENTS OF THE INVENTION

Figure 1:
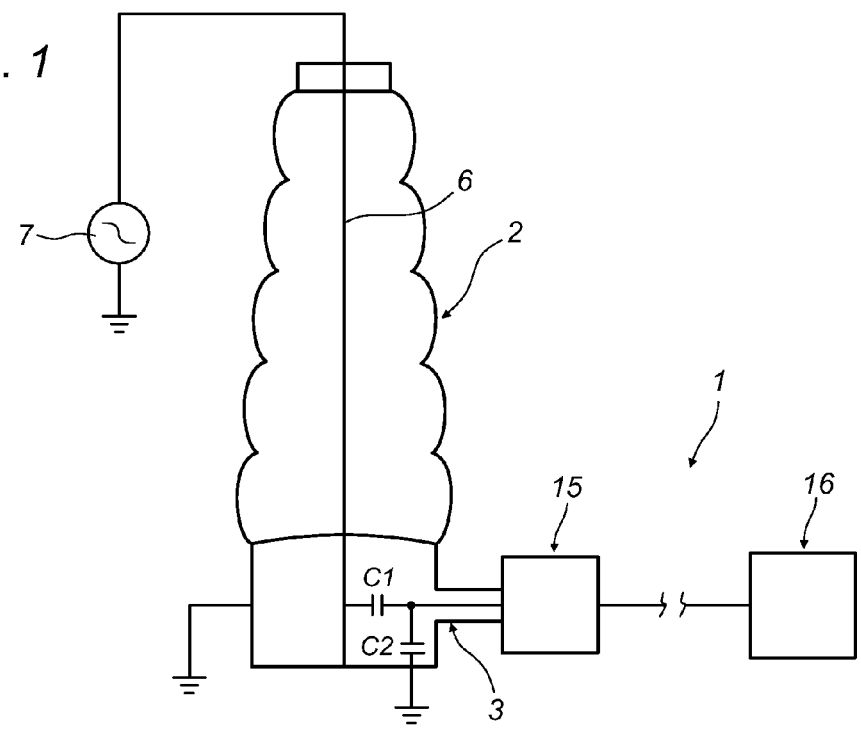
FIG. 1 schematically illustrates an apparatus according to the invention coupled to the tap adapter of an insulator.

The numeral 1 in the drawings denotes an apparatus for measuring the loss factor (also known as tan delta, or power factor, or loss tangent) of an insulator 2 for medium or high voltages.

More specifically, the insulator 2 is an insulator equipped with a tap adapter 3 forming a point for picking up an electrical signal 4.

In a preferred application of this invention, the apparatus 1 is an apparatus for measuring the loss factor of an insulator 2 of a medium- or high-voltage transformer 5.

Figure 2:
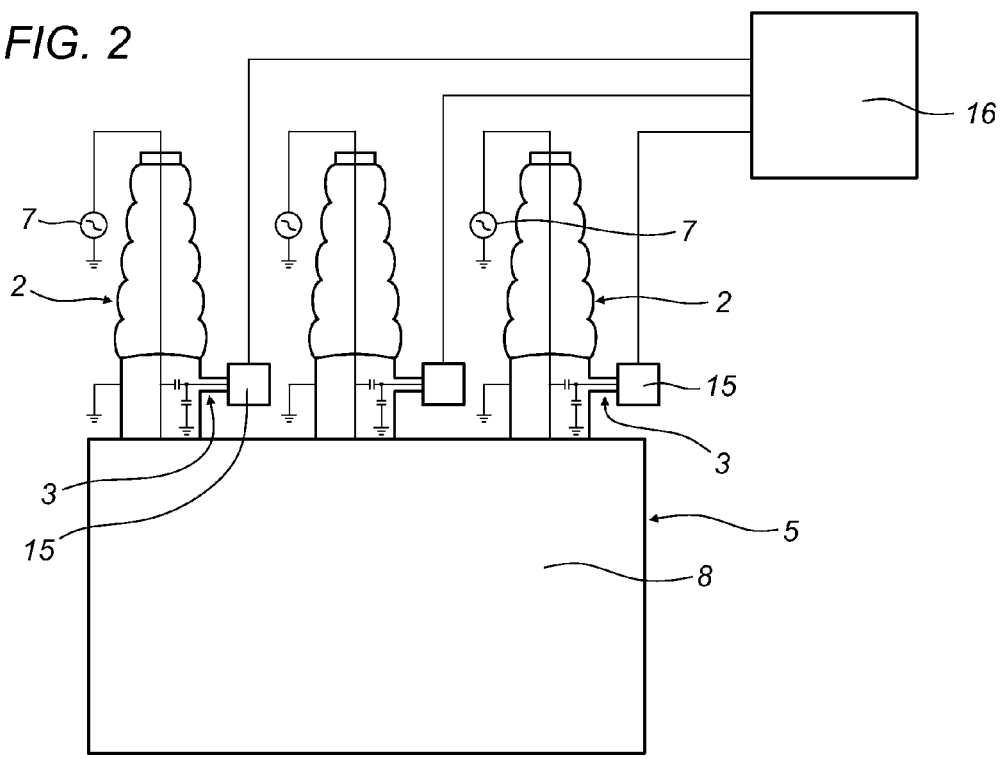
FIG. 2 illustrates a measuring instrument comprising the apparatus of FIG. 1, coupled to the insulators of a three-phase transformer.

FIG. 2 illustrates a three-phase transformer 5 having three medium- or high-voltage insulators 2 the apparatus 1 is coupled to.

The reference C1 denotes a capacitor corresponding to the insulator 2 being tested, while C2 denotes an eddy capacitor formed by the tap adapter.

The insulator 2 is designed to insulate a conductor 6 connected to a medium- or high-voltage source 7 relative to a body 8 connected to earth (for example the casing of a transformer).

The insulator 2 consists, for example, of an insulating layer wound round itself to form a plurality of mutually insulated layers according to a technique known in the field of insulators for medium or high voltages.

The apparatus 1 comprises a reference capacitor 9 having a first electrode 10, which is connectable to the tap adapter 3, and a second electrode 11.

The apparatus 1 also comprises a first voltage detection module 12 operatively connected to the first electrode 10 of the reference capacitor 9 for detecting a signal representative of the voltage applied to the reference capacitor 9.

According to the invention, the apparatus 1 also comprises an active electronic device 13. The device 13 is connected to earth and to the second electrode 11 of the reference capacitor 9.

The active electronic device 13 is configured to keep the potential of the second electrode 11 of the reference capacitor 9 at a predetermined reference value.

Preferably, the active electronic device 13 is configured to keep the second electrode 11 of the reference capacitor 9 at the potential of earth, that is to say, it is configured to keep the second electrode 11 of the reference capacitor 9 at virtual earth.

The active electronic device 13, however, might also be configured to keep the second electrode 11 of the reference capacitor 9 at a potential other than earth, provided always that it is a known potential, defined by the device 13 or by a circuit which the device 13 forms part of.

Preferably, the active electronic device 13 is an active current/voltage converter.

In the example illustrated, the active electronic device 13 comprises an operational amplifier 131 with a resistor 132 in the inverting amplifier configuration.

The apparatus 1 further comprises a second voltage detection module 14 operatively connected to an output of the active electronic device 13 in order to detect a signal representative of the electric current that flows through the reference capacitor 9.

It should be noted that the reference capacitor 9 and the active electronic device 13 form part of a sensor 15 for collecting data (that is, electrical quantities) from the signal 4 picked up by the tap adapter 3 of the insulator 2, to allow the loss factor of the insulator to be derived, that is, estimated.

In light of this, it should be noted that the apparatus 1 also comprises a measuring instrument 16 operatively connected to the sensor 15 for receiving the data (that is, the signals relating to the electrical quantities) collected by it.

For example, the measuring instrument 16 is connected to the sensor 15 by one or more coaxial cables 17.

The measuring instrument 16 comprises:
- a first input 18 operatively connected to the first electrode 10 of the reference capacitor 9;
- a second input 19 operatively connected to the output of the active electronic device 13;
- the first voltage detection module 12, connected to the first input 18;

the second voltage detection module 14, connected to the second input 19;

a processor 20 programmed to estimate a value of the loss factor as a function of the data detected (in particular, as a function of the signals, for example voltage signals, made available by the first and second detection modules 12 and 14) and to capture the signals and store the data detected.

Preferably the measuring instrument 16 is designed to capture and store the data detected, the first and second inputs 18, 19 forming a capture channel.

More specifically, the processor 20 is programmed to estimate a value of the loss factor as a function of the data detected at the same detection instant and on the same insulator 2.

With reference to FIG. 2, it should be noted that the apparatus 1 comprises a plurality of sensors 15, each of the sensors 15 being coupled to a corresponding insulator 2.

In light of this, the measuring instrument 16 comprises a plurality of capture channels, one for each sensor 15 in the plurality.

Preferably, the active electronic device 13 is configured to supply enough current to drive a 50 Ohm input impedance of the measuring instrument 16. In other terms, the active electronic device 13 has an adapted output at 50 Ohms.

Preferably, the first voltage detection module 12 has an impedance of at least 10 GOhm, and more preferably, at least 1 TOhm.

Preferably, the apparatus 1 (that is, the sensor 15 of the apparatus 1) comprises an operational amplifier 21 in buffer configuration, connected to the first electrode 10 of the reference capacitor 9.

The first voltage detection module 12 is operatively connected to an output of the operational amplifier 21 in buffer configuration.

This makes it possible to adapt a very high impedance (defined by the operational amplifier 21 in buffer configuration and necessary for measuring a quantity correlated with the voltage applied to the insulator 2) with a 50 Ohm input impedance of the measuring instrument 16 (more specifically, of the first input of the measuring instrument 16).

Preferably, the operational amplifier 21 in buffer configuration is configured to define a broad band so as to allow electrical signals representative of electric pulses correlated with partial electric discharges to be detected. These high-frequency signals (or signal components) are present in the voltage signal at the first electrode 10 of the reference capacitor 9.

The broad band (defined by the operational amplifier 21 in buffer configuration) preferably has a lower cut-off frequency of 0 Hz and an upper cut-off frequency of at least 100 KHz and, more preferably, of at least 1 MHz.

Preferably, the active electronic device 13 is configured to define a broad band to enable the second voltage detection module 14 to detect high-frequency electrical signals representative of electrical pulses correlated with partial discharges. These high-frequency signals (or signal components) are present in the electric current that flows through the reference capacitor 9.

The broad band (defined by the active electronic device 13) preferably has a lower cut-off frequency of 0 Hz and an upper cut-off frequency of at least 100 KHz; preferably, the upper cut-off frequency is of at least 1 MHz.

Preferably, the apparatus 1 (and more specifically, the sensor 15 of the apparatus 1) comprises a first overvoltage protection device 22 (for example, a surge arrester) connected across the first and second electrodes 10 and 11 of the reference capacitor 9.

Preferably, the apparatus 1 (and more specifically, the sensor 15 of the apparatus 1) also comprises a second overvoltage protection device 23 connected across the second electrode 11 of the reference capacitor 9 and earth.

Preferably, the overvoltage protection devices 22 and 23 comprise surge arresters of the inert gas discharge tube type (also known as "GDT"). Preferably, the overvoltage protection devices 22 and 23 are equipped with a safety device configured to short circuit the leg they are connected in if the device (surge arrester) itself comes into operation, in particular in the event of prolonged and continuous operation of the surge arrester device.

The apparatus 1 (and more specifically, the sensor 15 of the apparatus 1) further comprises a bypass circuit 161 connected to the active electronic device 13 to connect the first electrode 10 of the reference capacitor 9 to a passive electrical component (for example a resistor 162), to cut out the active electronic device 13 in response to a fault of the device 13 itself. The bypass circuit 161 is connected to the active electronic device 13 and is configured to connect the first electrode 10 of the reference capacitor 9 to a passive electrical component 162, to cut out the active electronic device 13 in response to a fault of the device itself.

It should be noted that the bypass circuit is configured to divert the node 10 towards a passive component so that the pick-up point 4 in the tap adapter 3 is never left to float (for safety reasons).

According to another aspect, this invention provides an apparatus 1 for measuring the loss factor of an insulator 2 for medium or high voltages, equipped with the tap adapter 3 forming a point for picking up an electrical signal, comprising:

the reference capacitor 9 (with the first electrode 10, which is connectable to the tap adapter 3, and a second electrode 11);

the first voltage detection module 12, which is operatively connected to the first electrode 10 of the reference capacitor 9 for detecting a signal representative of the voltage applied to the reference capacitor 9.

According to the invention (according to said further aspect of the invention), the apparatus 1 comprises a generator module 24, connected to the first electrode 10 of the reference capacitor 9, for injecting a direct electric current into the insulation.

More specifically, the generator module 24 is configured to inject a predetermined electric current into a node defined by the first electrode 10 of the reference capacitor 9. Of this injected current, at least a portion (in practice, a preponderant portion) flows through the insulation of the insulator 2.

In light of this, the first detection module 12 is configured to detect a mean voltage value from the signal picked up, so as to measure a voltage variation caused by the direct current which travels the insulator 2.

Figure 4:
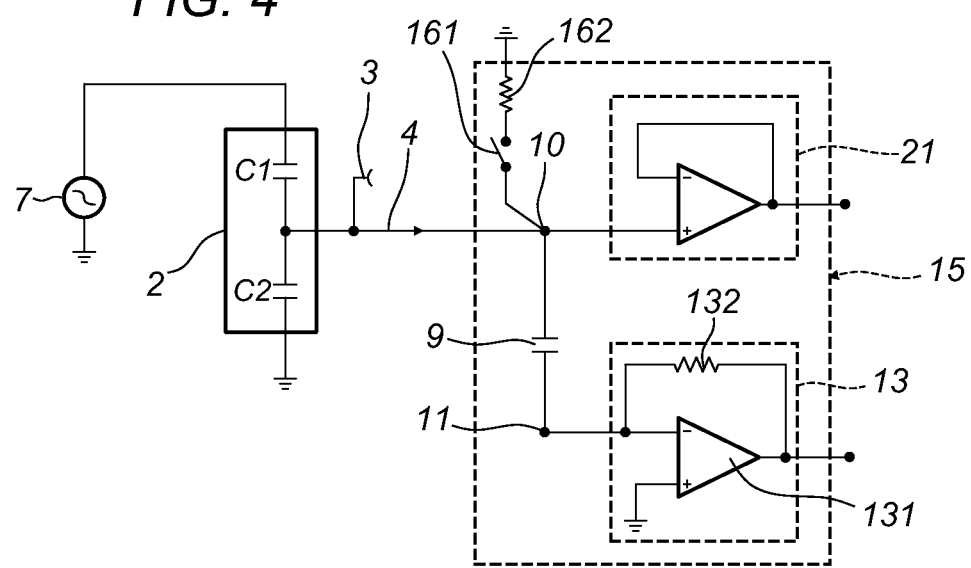
FIG. 4 is a circuit diagram of a sensor of the apparatus of FIG. 1.

On the other hand, the apparatus 1 (and more specifically, the sensor 15 of the apparatus 1) according to the first aspect of the invention (that is, the presence of the active electronic device 13) is schematically illustrated in FIG. 4.

Figure 3:
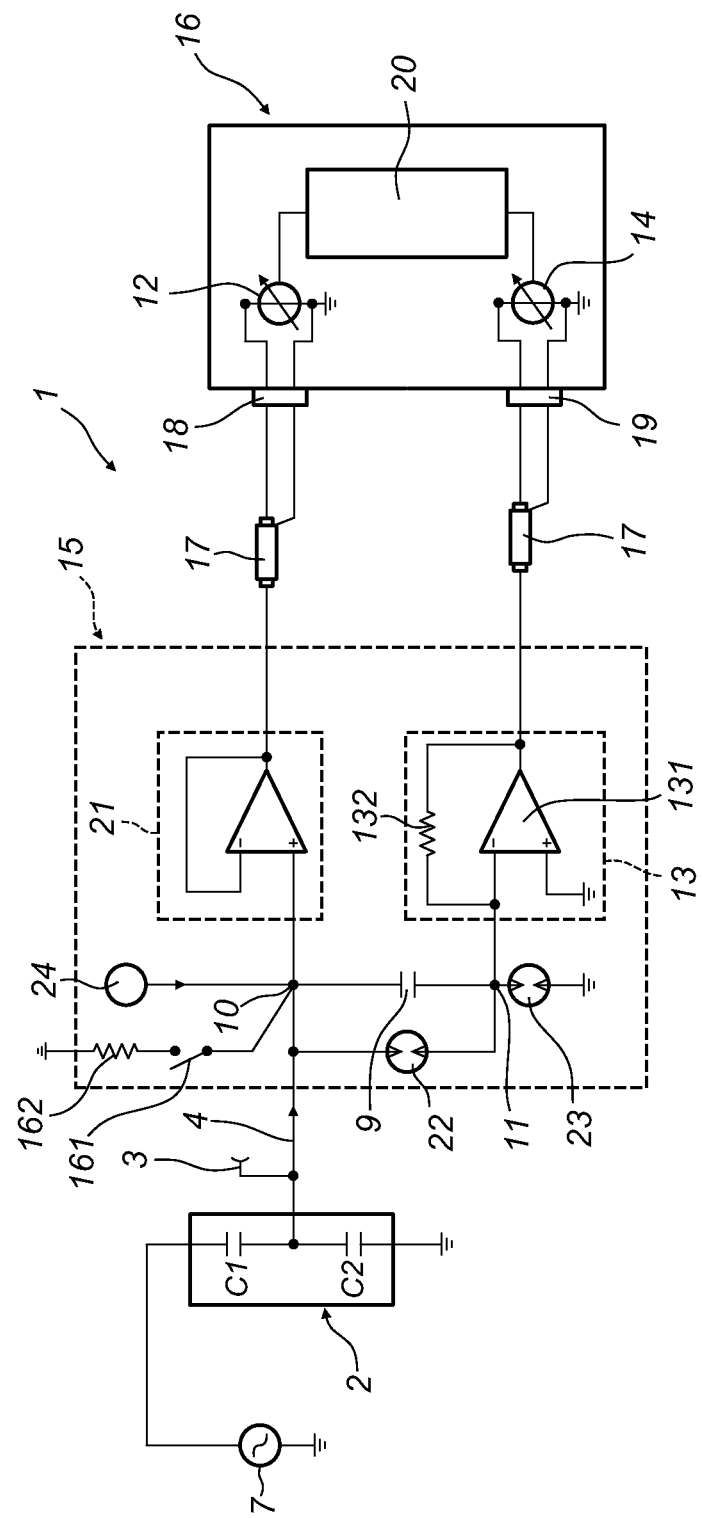
FIG. 3 is a circuit diagram of the apparatus of FIG. 1.

In the preferred embodiment illustrated in FIG. 3, however, the apparatus 1 has both of these features (that is, the active electronic device 13 and the generator module 24).

It should be noted that these features interact in synergy.

In effect, the active electronic device 13 is preferably configured to keep the potential of the second electrode 11 of the reference capacitor at a predetermined reference value (preferably virtual earth), compensating a variation of direct current voltage in the second electrode 11 of the reference capacitor 9 caused by the injected current).

That makes it possible to perform a particularly accurate and complete measurement.

The invention also provides a method for measuring the loss factor of the insulator 2 for medium or high voltages, equipped with the tap adapter 3 forming a point for picking up an electrical signal 4.

The method comprises a step of preparing a reference capacitor 9 having a first electrode 10 and a second electrode 11 and connecting the first electrode 10 to the tap adapter 3.

According to a first aspect of the invention, the method comprises the following steps:

preparing an active electronic device 13 connected to earth and to the second electrode 11 of the reference capacitor 9 and configured to keep the potential of the second electrode 11 at a predetermined reference value;

detecting a signal representative of the voltage applied to the reference capacitor 9, using a first voltage detection module 12 connected to the first electrode 10 of the reference capacitor 9;

detecting a signal representative of the electric current that flows through the reference capacitor 9, using a second voltage detection module 14 connected downstream of the active electronic device 13.

According to a second aspect of the invention, the method comprises the following steps:

injecting a direct electric current into the first electrode 10 of the reference capacitor 9 in order to generate a dc voltage variation in the insulator 2;

detecting a signal representative of the voltage applied to the reference capacitor 9 (that is, representative of the voltage applied to the insulator 2) using a first voltage detection module connected to the first electrode 10 of the reference capacitor 9.

In that case, the signal representative of the voltage applied to the insulator 2 comprises a dc voltage contribution due to the flow of the injected current through the insulator 2.

Advantageously, that makes it possible to derive a full data set for estimating the value of the loss factor of the insulator 2.

In light of this, the method comprises a further step of processing the collected data in order to derive an estimated value of the loss factor of the insulator 2. Preferably, this estimated value is derived during the processing step as a function of the data detected during a single detection instant and on a single insulator.

This advantageously makes it possible to avoid having to make comparisons with data obtained previously and/or with data detected on other insulators, if any, of the same electrical apparatus (for example, a three-phase transformer 5).

This makes the method (and the related apparatus) particularly effective and quick to provide estimations useful for diagnostic purposes.

It should be noted that the first and second aspects of the invention might be implemented separately and independently of each other. These aspects are preferably implemented together, however, since their effects act in synergy.

Thus, detection of the direct current component of the voltage variation on the insulator caused by the injected current adds to the detected data precious information for estimating the value of the loss factor.

Besides, the presence of the active electronic device 13 assists in the detection of the direct current component since it steadies the voltage applied to the reference capacitor.

It should also be noted that the intention of this document is to describe and protect the above mentioned aspects of the invention both separately and in combination.

It should nevertheless be noted that the apparatus and method according to the invention do, however, contemplate performing (during the step of processing the collected data) comparisons with data previously detected and stored and calculating parameters based on the ratio between quantities detected on different insulators 2 of a single transformer 5 (or other poly—phase apparatus).

It should also be noted that this document also regards and intends protecting both the apparatus 1 (comprising the sensor 15 and the instrument 16, in combination), and the sensor 15 as such.

The invention claimed is:

1. An apparatus for measuring the loss factor of an insulator for medium or high voltages, equipped with a tap adapter forming a point for picking up an electrical signal, comprising:

a reference capacitor of known capacitance value, having a first electrode, which is connectable to the tap adapter, and a second electrode;

a first voltage detection module, which is operatively connected to the first electrode of the reference capacitor for detecting a signal representative of the voltage applied to the reference capacitor;

an active electronic device connected to earth and to the second electrode of the reference capacitor and configured to keep the potential of the second electrode at a predetermined reference value;

a second voltage detection module operatively connected to an output of the active electronic device in order to detect a signal representative of the electric current that flows through the reference capacitor, an operational amplifier in buffer configuration, connected to the first electrode of the reference capacitor, the first voltage detection module being operatively connected to an output of the operational amplifier in buffer configuration, wherein the operational amplifier in buffer configuration is configured to define a broad band having a lower cut-off frequency of 0 Hz and an upper cut-off frequency of at least 100 kHz, so as to allow detection of high-frequency electrical signals representative of electric pulses correlated with partial electric discharges present in the voltage at the first electrode of the reference capacitor.

2. The apparatus according to claim 1, wherein the apparatus is an apparatus for measuring the loss factor of an insulator of a medium- or high-voltage transformer.

3. The apparatus according to claim 1, wherein the active electronic device is an active current/voltage converter.

4. The apparatus according to claim 3, wherein the active electronic device comprises an operational amplifier controlled by feedback from a resistor.

5. The apparatus according to claim 1, wherein the first voltage detection module has an impedance of at least 10 Giga Ohm.

6. An apparatus for measuring the loss factor of an insulator for medium or high voltages, equipped with a tap adapter forming a point for picking up an electrical signal, comprising:

a reference capacitor of known capacitance value, having a first electrode, which is connectable to the tap adapter, and a second electrode;

a first voltage detection module, which is operatively connected to the first electrode of the reference capacitor for detecting a signal representative of the voltage applied to the reference capacitor;

an active electronic device connected to earth and to the second electrode of the reference capacitor and configured to keep the potential of the second electrode at a predetermined reference value;

a second voltage detection module operatively connected to an output of the active electronic device in order to detect a signal representative of the electric current that flows through the reference capacitor, wherein the active electronic device is configured to define a broad band having a lower cut-off frequency of 0 Hz and an upper cut-off frequency of at least 100 kHz, so as to allow the second voltage detection module to detect high-frequency electrical signals representative of electric pulses correlated with partial electric discharges present in the electric current which flows through the reference capacitor.

7. The apparatus according to claim 1, comprising an overvoltage protection device connected across the first and second electrodes of the reference capacitor.

8. The apparatus according to claim 1, comprising an overvoltage protection device connected across the second electrode of the reference capacitor and earth.

9. The apparatus according to claim 7, wherein the overvoltage protection device is a surge arrester of the inert gas type equipped with a safety device configured to short circuit the leg it is connected in if the surge arrester itself comes into operation.

10. An apparatus for measuring the loss factor of an insulator for medium or high voltages, equipped with a tap adapter forming a point for picking up an electrical signal, comprising:

a reference capacitor of known capacitance value, having a first electrode, which is connectable to the tap adapter, and a second electrode;

a first voltage detection module, which is operatively connected to the first electrode of the reference capacitor for detecting a signal representative of the voltage applied to the reference capacitor;

an active electronic device connected to earth and to the second electrode of the reference capacitor and configured to keep the potential of the second electrode at a predetermined reference value;

a second voltage detection module operatively connected to an output of the active electronic device in order to detect a signal representative of the electric current that flows through the reference capacitor, a bypass circuit connected to the active electronic device to connect the first electrode of the reference capacitor to a passive electrical component to cut out the active electronic device in response to a fault of the device itself.

11. The apparatus according to claim 1, comprising a measuring instrument having:

a first input operatively connected to the first electrode of the reference capacitor;

a second input operatively connected to the output of the active electronic device;

a processor programmed to estimate a value of the loss factor as a function of the data detected at the same detection instant and on the same insulator, the measuring instrument comprising the first and second voltage detection modules in order to capture and store the data detected by them.

12. The apparatus according to claim 11, wherein the active electronic device is configured to supply enough current to drive a 50 Ohm input impedance of the measuring instrument.

13. The apparatus according to claim 1, comprising a generator module connected to the first electrode of the reference capacitor in order to inject a direct electric current into the insulator.

14. The apparatus according to claim 13, wherein the first detection module is configured to detect a mean voltage value from the signal picked up, so as to measure a voltage variation caused by the direct current which travels the insulator.

15. The apparatus according to claim 13, wherein the active electronic device is configured to keep the potential at the predetermined reference value, compensating a variation of direct current voltage in the second electrode of the reference capacitor caused by the injected current, keeping it at virtual earth.

16. A method for measuring the loss factor of an insulator for medium or high voltages, equipped with a tap adapter forming a point for picking up an electrical signal, comprising the following steps:

preparing a reference capacitor having a first electrode and a second electrode and connecting the first electrode to the tap adapter;

preparing an active electronic device connected to earth and to the second electrode of the reference capacitor and configured to keep the potential of the second electrode at a predetermined reference value, wherein the active electronic device is configured to define a broad band having an upper cut-off frequency of at least 100 kHz, so as to allow the second voltage detection module to detect high-frequency electrical signals representative of electric pulses correlated with partial electric discharges present in the electric current which flows through the reference capacitor;

detecting a signal representative of the voltage applied to the reference capacitor, using a first voltage detection module connected to the first electrode of the reference capacitor;

detecting a signal representative of the electric current that flows through the reference capacitor, using a second voltage detection module connected downstream of the active electronic device.

17. The method according to claim 16, comprising a step of injecting a direct electric current into the first electrode of the reference capacitor in order to generate a dc voltage variation in the insulator.

18. A method for measuring the loss factor of an insulator for medium or high voltages, equipped with a tap adapter forming a point for picking up an electrical signal, comprising the following steps:

preparing a reference capacitor having a first electrode and a second electrode and connecting the first electrode to the tap adapter;

preparing an active electronic device connected to earth and to the second electrode of the reference capacitor and configured to keep the potential of the second electrode at a predetermined reference value;

detecting a signal representative of the voltage applied to the reference capacitor, using a first voltage detection module connected to the first electrode of the reference capacitor;

detecting a signal representative of the electric current that flows through the reference capacitor, using a second voltage detection module connected downstream of the active electronic device;

cutting out the active electronic device in response to a fault of the device itself, through a bypass circuit connected to the active electronic device to connect the first electrode of the reference capacitor to a passive electrical component.

* * * * *